United States Patent
Ji et al.

(10) Patent No.: US 9,564,191 B1
(45) Date of Patent: Feb. 7, 2017

(54) SIGNAL COMPENSATION CIRCUIT AND SEMICONDUCTOR APPARATUS USING THE SAME

(71) Applicant: SK hynix Inc., Icheon-si Gyeonggi-do (KR)

(72) Inventors: Jung Hwan Ji, Icheon-si (KR); Ki Chon Park, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/047,116

(22) Filed: Feb. 18, 2016

(30) Foreign Application Priority Data

Sep. 7, 2015 (KR) ........................ 10-2015-0126350

(51) Int. Cl.
| | |
|---|---|
| G11C 7/00 | (2006.01) |
| G11C 7/22 | (2006.01) |
| G11C 7/08 | (2006.01) |
| G11C 7/12 | (2006.01) |

(52) U.S. Cl.
CPC ................. G11C 7/222 (2013.01); G11C 7/08 (2013.01); G11C 7/12 (2013.01)

(58) Field of Classification Search
CPC .............. H03G 7/00; H03G 3/32; H03G 3/00; H03G 3/30; H03G 9/00; H03G 9/02; H03G 3/20; H03G 7/06; H04R 25/00; H04R 27/00; H04R 3/00; H04R 29/00; H04R 3/02; G10L 21/00; G10L 21/02; G10L 19/00; G10L 11/00; G10L 11/02; G10L 15/20; G11C 2207/2254; G11C 7/1051; G11C 7/1066; G11C 7/1078; G11C 7/22; G11C 7/222; G11C 7/106; G11C 7/1072; G11C 7/1087; G11C 7/1093; G11C 8/18

USPC ..... 381/106, 104, 56, 107, 108, 71.1, 71.12, 381/71.14, 61, 71.11, 71.13, 73.1, 94.1, 381/94.3; 375/350, 348, 211, 349, 229; 365/194, 189.07, 191, 193, 233.1, 233.11, 365/233.13, 233.5

See application file for complete search history.

(56) References Cited

U.S. PATENT DOCUMENTS

2012/0182057 A1* 7/2012 Ma ...................... G11C 7/222
327/276

FOREIGN PATENT DOCUMENTS

KR       1020080003049 A        1/2008

* cited by examiner

*Primary Examiner* — Thong Q Le
(74) *Attorney, Agent, or Firm* — William Park & Associates Ltd.

(57) ABSTRACT

A signal compensation circuit includes a first path configured to cause a source signal to pass therethrough and be outputted as a first signal; a delay block configured to output a second signal by delaying the source signal by a predetermined time; a second path configured to cause the second signal to pass therethrough and be outputted as a third signal; and a signal combination block configured to generate a compensated signal by combining the first signal and the third signal.

18 Claims, 3 Drawing Sheets

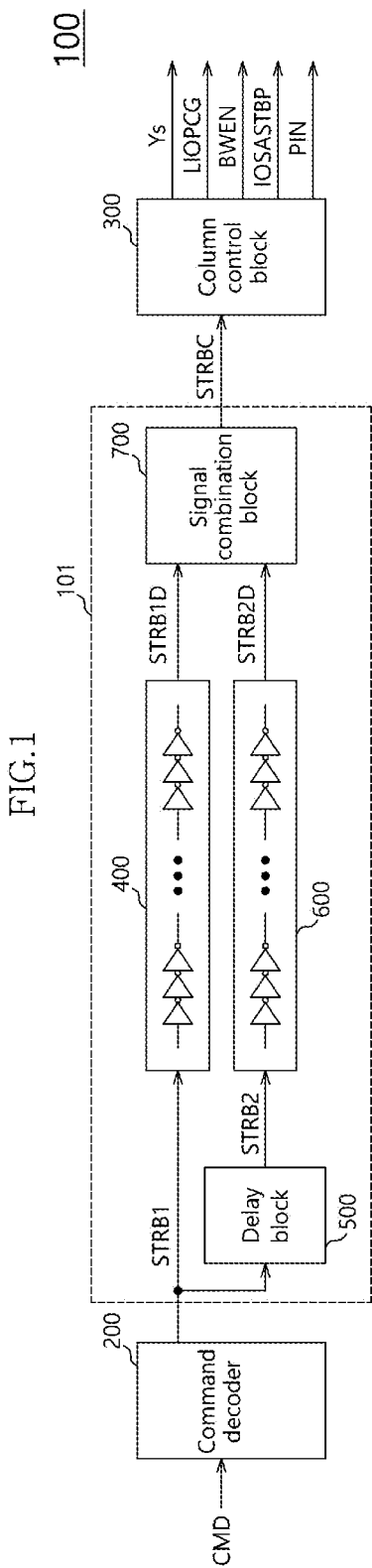
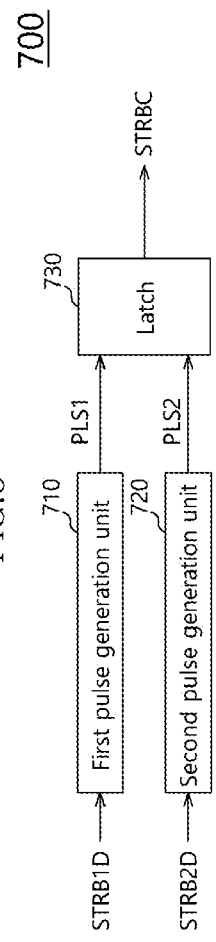

SIGNAL COMPENSATION CIRCUIT AND SEMICONDUCTOR APPARATUS USING THE SAME

CROSS-REFERENCES TO RELATED APPLICATION

The present application claims priority under 35 U.S.C. §119(a) to Korean application number 10-2015-0126350, filed on Sep. 7, 2015, in the Korean Intellectual Property Office, which is incorporated herein by reference in its entirety.

BACKGROUND

1. Technical Field

Various embodiments generally relate to a semiconductor circuit, and, more particularly, to a signal compensation circuit and a semiconductor apparatus using the same.

2. Related Art

A semiconductor apparatus may include various circuit blocks, and the various circuit blocks have their own functions.

The various circuit blocks operate only when the corresponding functions are performed, and otherwise do not perform any operations in a state in which only power is applied thereto.

For example, in a refresh mode, only circuits associated with an active or precharge operation operate, and circuits associated with read/write operations do not operate.

Considering that circuit blocks of a semiconductor apparatus are configured based on transistors, if a state in which only power such as VDD or VSS is applied to transistors is continuously retained, stresses may be induced in the transistors and the properties of the transistors may be degraded.

In this way, due to degradations in the properties of elements according to operating circumstances, signals may be abnormally generated from corresponding circuit blocks, and the operation performance of semiconductor circuits may deteriorate or operation fails may occur.

SUMMARY

In an embodiment, a signal compensation circuit may include a first path configured to cause a source signal to pass therethrough and be outputted as a first signal. The signal compensation circuit may also include a delay block configured to output a second signal by delaying the source signal by a predetermined time. The signal compensation circuit may also include a second path configured to cause the second signal to pass therethrough and be outputted as a third signal. In addition, the signal compensation circuit may also include a signal combination block configured to generate a compensated signal by combining the first signal and the third signal.

In an embodiment, a semiconductor apparatus may include a command decoder configured to generate a column strobe signal by decoding a command inputted from an exterior device. The semiconductor device may also include a signal compensation circuit configured to cause the column strobe signal to pass through a first path and a second path after being delayed by a predetermined time, and generate a compensated column strobe signal which is compensated for a pulse width variation of the column strobe signal, by combining an output of the first path and the second path. The semiconductor device may also include a column control block configured to generate a column control signal according to the compensated column strobe signal.

In an embodiment, a signal compensation circuit may include a first path configured to cause a column strobe signal to pass therethrough and be outputted as a first signal. The signal compensation circuit may also include a delay block configured to output a second signal by delaying the column strobe signal according to a pulse width of the column strobe signal. The signal compensation circuit may also include a second path configured by copying the first path, and configured to cause the second signal to pass therethrough and be outputted as a third signal. The signal compensation circuit may also include a signal combination block configured to generate a compensated column strobe signal according to an edge of the first signal and an edge of the third signal.

BRIEF DESCRIPTION OF THE DRAWINGS

FIG. 1 is a diagram illustrating a representation of an example of the configuration of a semiconductor apparatus 100 including a signal compensation circuit 101 in accordance with an embodiment.

FIG. 2 is a diagram illustrating a representation of an example of the configuration of the delay block 500 shown in FIG. 1.

FIG. 3 is a diagram illustrating a representation of an example of the configuration of the signal combination block 700 shown in FIG. 1.

DETAILED DESCRIPTION

Figure 4:
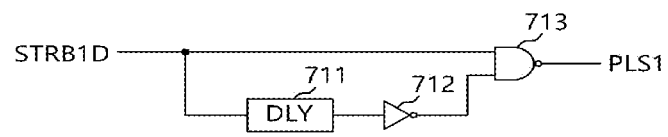
FIG. 4 is a diagram illustrating a representation of an example of the configuration of the first pulse generation unit 710 shown in FIG. 3.

Hereinafter, a signal compensation circuit and a semiconductor apparatus using the same will be described below with reference to the accompanying figures through various examples of embodiments. Various embodiments are directed to a signal compensation circuit capable of stable signal generation regardless of operation circumstances, and a semiconductor apparatus using the same. Referring to FIG. 1, a semiconductor apparatus 100 in accordance with an embodiment may include a signal compensation circuit 101, a command decoder 200, and a column control block 300.

The signal compensation circuit 101 may be configured to cause a source signal to pass through a first path and pass through a second path after being delayed by a predetermined time. The signal compensation circuit 101 may also combine the output of the first path and the output of the second path. The signal compensation circuit 101 may also generate a compensated signal which is compensated for a pulse width variation of the source signal.

The signal compensation circuit 101 may include a first path 400, a delay block 500, a second path 600, and a signal combination block 700.

The first path 400 may be inputted with a source signal, for example, a column strobe signal STRB1, and output a first signal STRB1D.

The first path 400 may be a path for transmitting the column strobe signal STRB1 to circuit components associated with read/write operations.

The delay block 500 may delay the column strobe signal STRB1 by a predetermined time. The predetermined time may be a time corresponding to the pulse width of the column strobe signal STRB1 (for example, 1 tCK as a time corresponding to one cycle of a clock signal). The delay block 500 may output a second signal STRB2.

The second path 600 as a path configured by copying the first path 400 may include the same circuit components as the first path 400. In addition, the circuit components may use the same transistors as those used in the first path 400.

The second path 600 may be inputted with the second signal STRB2, and output a third signal STRB2D.

The signal combination block 700 may combine the first signal STRB1D and the third signal STRB2D. The signal combination block 700 may also generate a compensated signal, that is, a compensated column strobe signal STRBC.

The command decoder 200 may decode a command CMD, and generate the column strobe signal STRB1.

The column control block 300 may generate various column control signals. The various column control signals may be for example, a column select signal Ys, a precharge signal LIOPCG, a write enable signal BWEN, a sense amplifier control signal IOSASTBP and a pipe latch control signal PIN, according to the compensated column strobe signal STRBC.

Referring to FIG. 2, the delay block 500 may include a flip-flop 501.

The flip-flop 501 may latch the column strobe signal STRB1 according to a clock signal CLK, and thereby cause the second signal STRB2 to be delayed by 1 tCK when compared to the column strobe signal STRB1.

Referring to FIG. 3, the signal combination block 700 may include a first pulse generation unit 710, a second pulse generation unit 720, and a latch 730.

The first pulse generation unit 710 may generate a first pulse PLS1 according to the first signal STRB1D.

The second pulse generation unit 720 may generate a second pulse PLS2 according to the third signal STRB2D.

The first pulse generation unit 710 and the second pulse generation unit 720 may be configured in the same way.

The latch 730 may generate the compensated column strobe signal STRBC according to the first pulse signal PLS1 and the second pulse signal PLS2.

Referring to FIG. 4, the first pulse generation unit 710 may include a delay DLY 711, and first and second logic gates 712 and 713.

The first pulse generation unit 710 may detect the rising edge of the first signal STRB1D. The first pulse generation unit 710 may also generate the first pulse signal PLS1 of a falling pulse type which has a predetermined width.

Figure 5:
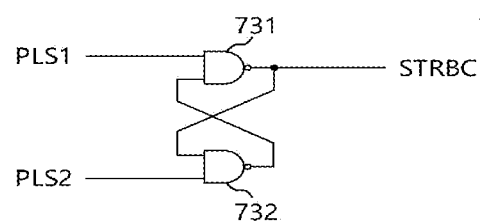
FIG. 5 is a diagram illustrating a representation of an example of the configuration of the latch 730 shown in FIG. 3.

Referring to FIG. 5, the latch 730 may be configured by an SR latch. The latch 730 may include first and second logic gates 731 and 732.

The latch 730 may set the compensated column strobe signal STRBC according to the first pulse signal PLS1. The latch 730 may also reset the compensated column strobe signal STRBC according to the second pulse signal PLS2.

The operation of the signal compensation circuit 101 in accordance with an embodiment, configured as mentioned above, will be described below with reference to FIGS. 1 to 6.

The command decoder 200 generates the column strobe signal STRB1 according to the command CMD inputted from an exterior device or source.

The command CMD may define read/write-associated operations of the semiconductor apparatus 100.

The column strobe signal STRB1 is outputted as the first signal STRB1D by passing through the first path 400.

Figure 6:
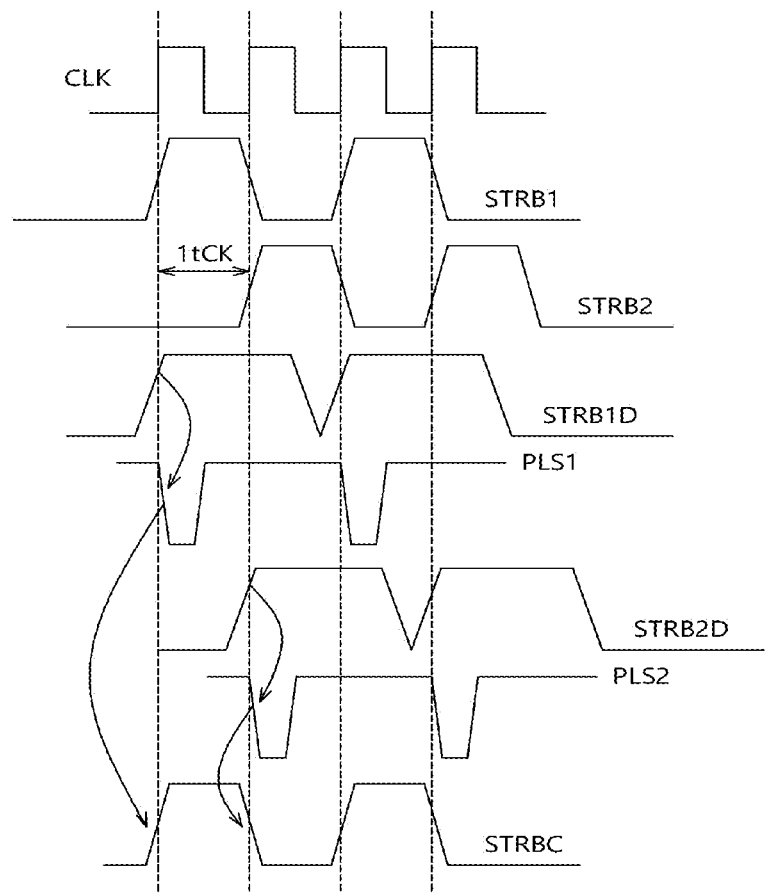
FIG. 6 is a representation of an example of a waveform diagram to assist in the explanation of the operation of the signal compensation circuit 101 in accordance with an embodiment.

Referring to FIG. 6, as the first signal STRB1D passes through the first path 400, the first signal STRB1D may have a waveform in which its pulse width is abnormally increased due to degradation of transistors configuring the first path 400.

The column strobe signal STRB1 is delayed by 1 tCK according to the clock signal CLK by the delay block 500, and is outputted as the second signal STRB2.

The second signal STRB2 is outputted as the third signal STRB2D by passing through the second path 600.

Since the second path 600 is configured by copying the first path 400, the second path 600 may have the same signal transmission characteristic as the first path 400.

Therefore, as shown in FIG. 6, as the third signal STRB2D passes through the second path 600, the third signal STRB2D may be increased in its pulse width in the same or substantially similar manner as the first signal STRB1D due to degradation of transistors configuring the second path 600.

The first pulse generation unit 710 of the signal combination block 700 detects the rising edge of the first signal STRB1D regardless of the pulse width of the first signal STRB1D. The first pulse generation unit 710 also generates the first pulse signal PLS1 of a falling pulse type.

The second pulse generation unit 720 of the signal combination block 700 detects the rising edge of the third signal STRB2D regardless of the pulse width of the third signal STRB2D. The second pulse generation unit 720 also generates the second pulse signal PLS2 of a falling pulse type.

The latch 730 of the signal combination block 700 generates the rising edge of the compensated column strobe signal STRBC according to the falling edge of the first pulse signal PLS1. The latch 730 also generates the falling edge of the compensated column strobe signal STRBC according to the falling edge of the second pulse signal PLS2.

Accordingly, the compensated column strobe signal STRBC has the same pulse width as the column strobe signal STRB1 regardless of the pulse widths of the first signal STRB1D and the third signal STRB2D.

The compensated column strobe signal STRBC is provided to the column control block 300.

The column control block 300 may stably generate various column control signals. The various column control signals may be for example, the column select signal Ys, the precharge signal LIOPCG, the write enable signal BWEN, the sense amplifier control signal IOSASTBP and the pipe latch control signal PIN, according to the compensated column strobe signal STRBC.

Figure 7:
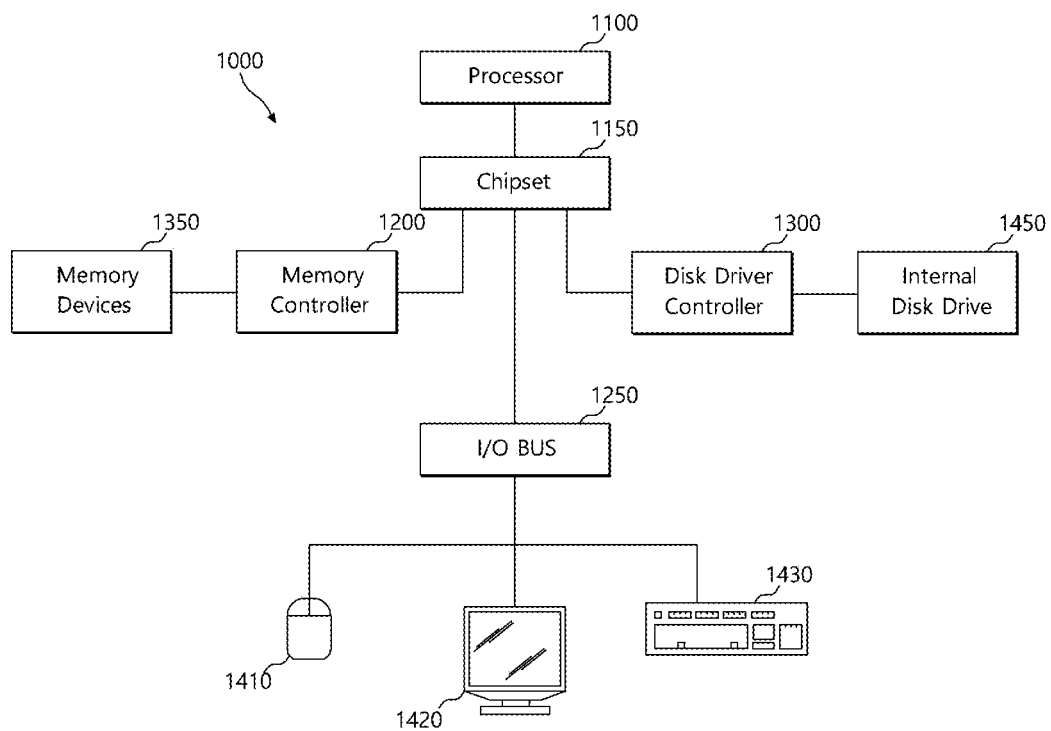
FIG. 7 illustrates a block diagram of a system employing a memory controller circuit in accordance with an embodiment of the invention.

Referring to FIG. 7, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory devices 1350 may include the semiconductor apparatus described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate the I/O devices 1410, 1420 and 1430.

The disk drive controller 1300 may also be electrically coupled to the chipset 1150. The disk drive controller 1300 may serve as the communication pathway between the chipset and one or more internal disk drives 140. The disk drive controller 1300 and the internal disk drives 1450 may communicate with each other with the chipset using virtually any type of communication protocol.

While various embodiments have been described above, it will be understood to those skilled in the art that the embodiments described are examples only. Accordingly, the signal compensation circuit and the semiconductor apparatus using the same described herein should not be limited based on the described embodiments above.

What is claimed is:

1. A signal compensation circuit comprising:
   a first path configured to cause a source signal to pass therethrough and be outputted as a first signal;
   a delay block configured to output a second signal by delaying the source signal by a predetermined time;
   a second path configured to cause the second signal to pass therethrough and be outputted as a third signal; and
   a signal combination block configured to generate a compensated signal by combining the first signal and the third signal,
   wherein the predetermined time corresponds to a pulse width of the source signal.

2. The signal compensation circuit according to claim 1, wherein the first path is a path for transmitting the source signal to circuit components associated with read/write operations of a semiconductor apparatus.

3. The signal compensation circuit according to claim 1, wherein the delay block is configured to output the second signal by delaying the source signal according to a pulse width of the source signal.

4. The signal compensation circuit according to claim 1, wherein the second path is configured by copying the first path.

5. The signal compensation circuit according to claim 1, wherein the signal combination block comprises:
   a first pulse generation circuit configured to generate a first pulse signal according to the first signal;
   a second pulse generation circuit configured to generate a second pulse signal according to the third signal; and
   a latch configured to generate the compensated signal according to the first pulse signal and the second pulse signal.

6. The signal compensation circuit according to claim 1, wherein a pulse width of the first signal is increased when it passes through the first path.

7. The signal compensation circuit according to claim 1, wherein a pulse width of the third signal is increased as it passes through the second path.

8. A semiconductor apparatus comprising:
   a command decoder configured to generate a column strobe signal by decoding a command inputted from an exterior device;
   a signal compensation circuit configured to cause the column strobe signal to pass through a first path and a second path after being delayed by a predetermined time, and generate a compensated column strobe signal which is compensated for a pulse width variation of the column strobe signal, by combining an output of the first path and the second path; and
   a column control block configured to generate a column control signal according to the compensated column strobe signal.

9. The semiconductor apparatus according to claim 8, wherein the column control signal comprises one or more of a column select signal, a precharge signal, a write enable signal, a sense amplifier control signal and a pipe latch control signal.

10. The semiconductor apparatus according to claim 8, wherein the signal compensation circuit comprises:
    a first path configured to cause the column strobe signal to pass therethrough and be outputted as a first signal;
    a delay block configured to output a second signal by delaying the column strobe signal by an other predetermined time;
    a second path configured to cause the second signal to pass therethrough and be outputted as a third signal; and
    a signal combination block configured to generate the compensated column strobe signal by combining the first signal and the third signal.

11. The semiconductor apparatus according to claim 10, wherein the first path transmits the column strobe signal to circuit components associated with read/write operations of a semiconductor apparatus.

12. The semiconductor apparatus according to claim 10, wherein the delay block is configured to output the second signal by delaying the column strobe signal according to a pulse width of the column strobe signal.

13. The semiconductor apparatus according to claim 10, wherein the second path is configured by copying the first path.

14. The semiconductor apparatus according to claim 10, wherein the signal combination block comprises:
    a first pulse generation circuit configured to generate a first pulse signal according to the first signal;
    a second pulse generation circuit configured to generate a second pulse signal according to the third signal; and
    a latch configured to generate the compensated column strobe signal according to the first pulse signal and the second pulse signal.

15. A signal compensation circuit comprising:
    a first path configured to cause a column strobe signal to pass therethrough and be outputted as a first signal;
    a delay block configured to output a second signal by delaying the column strobe signal according to a pulse width of the column strobe signal;
    a second path configured by copying the first path, and configured to cause the second signal to pass therethrough and be outputted as a third signal; and
    a signal combination block configured to generate a compensated column strobe signal according to an edge of the first signal and an edge of the third signal.

16. The signal compensation circuit according to claim 15, wherein the first path transmits the column strobe signal to circuit components associated with read/write operations of a semiconductor apparatus.

17. The signal compensation circuit according to claim 15, wherein the delay block is configured to output the second signal by delaying the column strobe signal by one cycle of a clock signal.

18. The signal compensation circuit according to claim 15, wherein the signal combination block comprises:
- a first pulse generation circuit configured to generate a first pulse signal according to a rising edge of the first signal;
- a second pulse generation circuit configured to generate a second pulse signal according to a rising edge of the third signal; and
- a latch configured to generate a rising edge of the compensated column strobe signal according to a falling edge of the first pulse signal, and generate a falling edge of the compensated column strobe signal according to a falling edge of the second pulse signal.

* * * * *